(12) United States Patent
Neumann et al.

(10) Patent No.: US 8,477,871 B2
(45) Date of Patent: Jul. 2, 2013

(54) RADIO STATION AND ACTIVE ANTENNA ARRAY

(75) Inventors: Dirk Neumann, Ulm (DE); Peter Kenington, Chepstow (GB)

(73) Assignee: Ubidyne Inc., Wilmington, DE (US)

( * ) Notice: Subject to any disclaimer, the term of this patent is extended or adjusted under 35 U.S.C. 154(b) by 580 days.

(21) Appl. No.: 12/648,000

(22) Filed: Dec. 28, 2009

(65) Prior Publication Data

US 2010/0166109 A1 Jul. 1, 2010

Related U.S. Application Data

(60) Provisional application No. 61/141,883, filed on Dec. 31, 2008.

(51) Int. Cl.
*H04K 1/02* (2006.01)
*H04L 25/03* (2006.01)
*H04L 25/49* (2006.01)

(52) U.S. Cl.
USPC .......................................... 375/296; 375/295

(58) Field of Classification Search
USPC ................................................. 375/296, 295
See application file for complete search history.

(56) References Cited

U.S. PATENT DOCUMENTS

| | | | |
|---|---|---|---|
| 5,748,683 A | 5/1998 | Smith et al. | |
| 5,852,630 A | 12/1998 | Langberg et al. | |
| 6,133,868 A | 10/2000 | Butler et al. | |
| 6,157,340 A | 12/2000 | Xu et al. | |
| 6,477,477 B1 | 11/2002 | Thron et al. | |
| 6,735,182 B1 | 5/2004 | Nishimori et al. | |
| 6,934,341 B2 | 8/2005 | Sahlman | |
| 6,943,627 B2 | 9/2005 | Leyonhjelm et al. | |
| 8,064,850 B2 | 11/2011 | Yang et al. | |
| 2003/0053552 A1 | 3/2003 | Hongo et al. | |
| 2003/0142012 A1 | 7/2003 | Hirabe | |
| 2004/0105509 A1 | 6/2004 | McGowan et al. | |
| 2004/0246048 A1* | 12/2004 | Leyonhjelm et al. | ............. 330/2 |
| 2005/0110565 A1 | 5/2005 | Robinson | |

(Continued)

FOREIGN PATENT DOCUMENTS

| | | |
|---|---|---|
| WO | 00/03479 | 1/2000 |
| WO | 2010/092076 | 8/2010 |
| WO | 2010/092082 | 8/2010 |

OTHER PUBLICATIONS

Mekechuk et al, Linearizing Power Amplifiers Using Digital Predistortion, EDA Tools and Test Hardware, High Frequency Electronics, Apr. 2004, 7 pages.

*Primary Examiner* — Shuwang Liu
*Assistant Examiner* — Nader Bolourchi

(57) ABSTRACT

The present disclosure relates to a radio station providing a digital predistortion to be imposed on a payload signal. The digital predistortion is usable as a general predistortion for several transmit paths of the radio station. The radio station provides coupled transmit signals to be combined within a combiner forming a common feedback signal. The common feedback signal is relayed along a common feedback path. A digital predistortion update unit to updates the digital predistortion in order to linearize a transfer characteristics of the transmit paths. The disclosure relates to a method of digitally predistorting a payload signal in order to linearize a transmit characteristics of the transmit paths. The disclosure further relates to computer program products for the manufacture of the radio station and/or a computer product for the execution of the method digitally predistorting. The disclosure further relates to an antenna array comprising the radio station.

35 Claims, 10 Drawing Sheets

U.S. PATENT DOCUMENTS

| | | |
|---|---|---|
| 2005/0239419 A1 | 10/2005 | Fudaba et al. |
| 2008/0143562 A1* | 6/2008 | Huang et al. ................. 341/118 |
| 2008/0232492 A1 | 9/2008 | Xiao et al. |
| 2012/0020392 A1* | 1/2012 | O'Keeffe et al. ............. 375/221 |
| 2012/0027066 A1* | 2/2012 | O'Keeffe ..................... 375/224 |

* cited by examiner

RADIO STATION AND ACTIVE ANTENNA ARRAY

CROSS REFERENCE TO OTHER APPLICATIONS

This application claims the benefit of U.S. Provisional Application No. 61/141,883, filed on Dec. 31, 2008. The entire disclosure of the foregoing application is incorporated herein by reference. This application is related to U.S. patent application Ser. No. 12/648,028, entitled "Method For Digitally Predistorting A Payload Signal and Radio Station Incorporating the Method", filed Dec. 28, 2009 and claiming the benefit of U.S. Provisional Application No. 61/141,905 filed on Dec. 31, 2008. The entire disclosure of the foregoing application is incorporated herein by reference.

FIELD OF THE INVENTION

The field of the invention relates to a radio station incorporating a digital predistortion of a payload signal. In particular the radio station is embedded within the active antenna array. The field of the invention further relates to a method for digitally predistorting a payload signal.

BACKGROUND OF THE INVENTION

With the increasing use of mobile communication systems, system operators of mobile communication systems need more transmitters, such as radio stations typically being part of base stations, in order to meet the increased demand for telecommunication. Increasing the number of the base stations is expensive for the system operator. For example, maintenance of the base stations, i.e. the radio stations, may require an engineer to be present at the site of the base station. The increased number of the base stations could therefore require an increased number of service engineers to serve the increased number of the base stations. There are code sharing (Code Division Multiple Access CDMA) and time division (Time Division Multiple Access TDMA) strategies to increase the amount of customers served by an individual one of the base stations.

Nowadays antenna arrays are used in the field of mobile communications systems in order to reduce power transmitted to a handset of a customer and thereby increase the efficiency of the base station, i.e. the radio station. The radio station typically comprises a plurality of antenna elements, i.e. an antenna array adapted for transceiving a payload signal. Typically the radio station comprises a plurality of transmit paths, each of the transmit paths being terminated by one of the antenna elements. The plurality of the antenna elements used in the radio station typically allows steering of a beam transmitted by the active antenna array. The steering of the beam includes but is not limited to at least one of: detection of direction of arrival (DOA), beam forming, down tilting and beam diversity. These techniques of beam steering are well-known in the art.

The code sharing and time division strategies as well as the beam steering rely on the radio station and the active antenna array to transmit and receive within well defined limits set by communication standards. The communications standards typically provide a plurality of channels or frequency bands useable for an uplink communication from the handset to the radio station as well as for a downlink communication from the radio station to the handset. For the radio station to comply with the communication standards it is of interest to reduce so called out of band emissions, i.e. transmission out of a communication frequency band or channel as defined by the communication standards.

For the transmission of the payload signal the base station comprises an amplifier within the transmit paths of the radio station. Typically, each one of the transmit paths comprises an individual one of the amplifiers. The amplifier typically introduces nonlinearities into the transmit paths. The nonlinearities introduced by the amplifier affect a transfer characteristic of the transmit paths. The nonlinearities introduced by the amplifier distort the payload signal relayed by the radio station as a transmit signal along the transmit paths.

The term "transfer characteristics" of a device, such as the amplifier can be construed as follows: Suppose the device has an input port for accepting an input signal and an output port to yield an output signal in response to the input signal. Such a device is referred to as a two-port device if there is only one input port and one output port. The transfer characteristics may likewise be defined for devices comprising a plurality of input ports and/or a plurality of output ports. The transfer characteristics of the device describe how the input signal(s) yield the output signal. It is known in the art that the transfer characteristics of a nonlinear device, for example a diode or the amplifier, generally comprises a nonlinearity.

The concept of predistortion or digital predistortion uses the output signal of the device, for example from the amplifier, for correcting the nonlinear transfer characteristics. Utilizing a feedback process the output signal is compared to the input signal and from this comparison an "inverse distortion" is added and/or multiplied to the input signal in order to linearise the transfer characteristics of the device. By carefully adjusting the predistortion, the nonlinear transfer characteristics of the amplifier can be corrected.

To apply the predistortion to the amplifier it is of interest to know the distortions or nonlinearities introduced by the amplifier. This is commonly achieved by the feedback of the transmit signal to a predistortion module. The predistortion module is adapted to compare the transmitted signal with a signal prior to amplification in order to determine the distortions introduced by the amplifier. The signal prior to amplification is for example the payload signal.

The concept of the predistortion has been explained in terms of correcting the transfer characteristics with respect of the amplitude. It is understood that predistortion may alternatively and/or additionally correct for nonlinearities with respect to a phase of the input signal and the output signal.

The nonlinearities of the transfer characteristics of the transmit path are typically dominated by the nonlinearities in the transfer characteristics of the amplifier. It is often sufficient to correct for the nonlinearities of the amplifier.

PRIOR ART

U.S. Pat. No. 6,943,627 B2, to Ericsson, provides a robust and non-invasive calibration of an adaptive signal conditioning system comprising a signal conditioning block in the signal path, a transmit path and a common feedback path. The Ericsson patent further discloses a reference signal in order to calibrate the feedback path prior to determining a required predistortion in order to linearise a transfer characteristic of the transmit path. The Ericsson patent provides a common feedback path for the digital predistortion and an individual digital predistortion for each one of the transmit paths.

BRIEF SUMMARY OF THE INVENTION

The present disclosure teaches a radio station. The radio station according to the teachings disclosed herein comprises a digital predistortion module, at least one transmit path, an RF amplifier, a coupler, a combiner, a common feedback path and a digital predistortion update module. The digital predistortion module is adapted to impose a digital predistortion onto a payload signal. The transmit path is adapted to relay the payload signal as the transmit signal. The RF amplifier is adapted to amplify a transmit signal. The payload signal is typically in the form of pairs of in phase and quadrature data (I, Q). The transmit path is terminated by an antenna element. The coupler is adapted to extract a coupled transmit signal out of the transmit signal. The combiner is adapted to combine the coupled transmit signals into a common feedback signal. The combiner, for example adds the coupled transmit signals with a well defined phase angle or phase difference between the coupled transmit signals. The common feedback signal travels along the common feedback path and reaches the digital predistortion update module. The digital predistortion update module is adapted to update the digital predistortion imposed on the payload signal, in order to linearise the transfer characteristics of the at least one transmit path.

The radio station has a single digital predistortion which is used for at least one of the transmit paths and is valid for all of the transmit paths. This allows an updating of the single digital predistortion in order to linearise all or some of the transmit paths of the radio station.

The disclosure further relates to a method for digitally predistorting a payload signal. The method for digitally predistorting the payload signal comprises accepting the payload signal to be relayed as a transmit signal along the at least one transmit path. The method further comprises imposing a digital predistortion on the payload signal. The method further comprises extracting at least one coupled transmit signal out of the transmit signals. The method further comprises combining the coupled transmit signal into a common feedback signal. The method further comprises an updating of the digital predistortion from the common feedback signal; thereby linearising a transfer characteristics of at least one transmit path.

The disclosure further relates to a computer program product embodied on a computer-readable medium. The computer program product comprises executable instructions for the manufacture of the radio station according the teachings disclosed herein. The disclosure further provides a computer program product comprising instructions that enable a processor to carry out the method for digitally predistorting a payload signal according to the teachings disclosed herein.

The disclosure further relates to an active antenna array comprising a radio station according to the teachings disclosed herein and a signal conditioner. The transmit paths of the radio station comprise an adjustable phase and magnitude between individual ones of the antenna elements. The signal conditioner is adapted to impose phase and amplitude differences between the antenna elements.

The disclosure further teaches a chipset comprising a digital predistortion module adapted to impose a digital predistortion on a payload signal, at least one transmit path adapted to relay the payload signal as a transmit signal, an RF amplifier within the at least one transmit path adapted to amplify the payload signal, a coupler adapted to extract at least one coupled transmit signal out of the transmit signal, a combiner adapted to combine the at least one coupled transmit signal into a common feedback signal; a common feedback path adapted to feed the common feedback signal to a digital predistortion update module adapted to update the digital predistortion; thus linearising transfer characteristics of at least one of the at least one transmit paths.

DETAILED DESCRIPTION OF THE INVENTION

For a better understanding of the present disclosure reference shall now be made to the preferred aspects of the present invention, examples of which are illustrated in the accompanying drawings.

It shall further be understood that the drawings are not to be construed in a limiting way. The scope of protection is defined by the claims as part of this application. For a person skilled in the art it is obvious that several aspects of the following description may as well be combined.

Figure 1A:
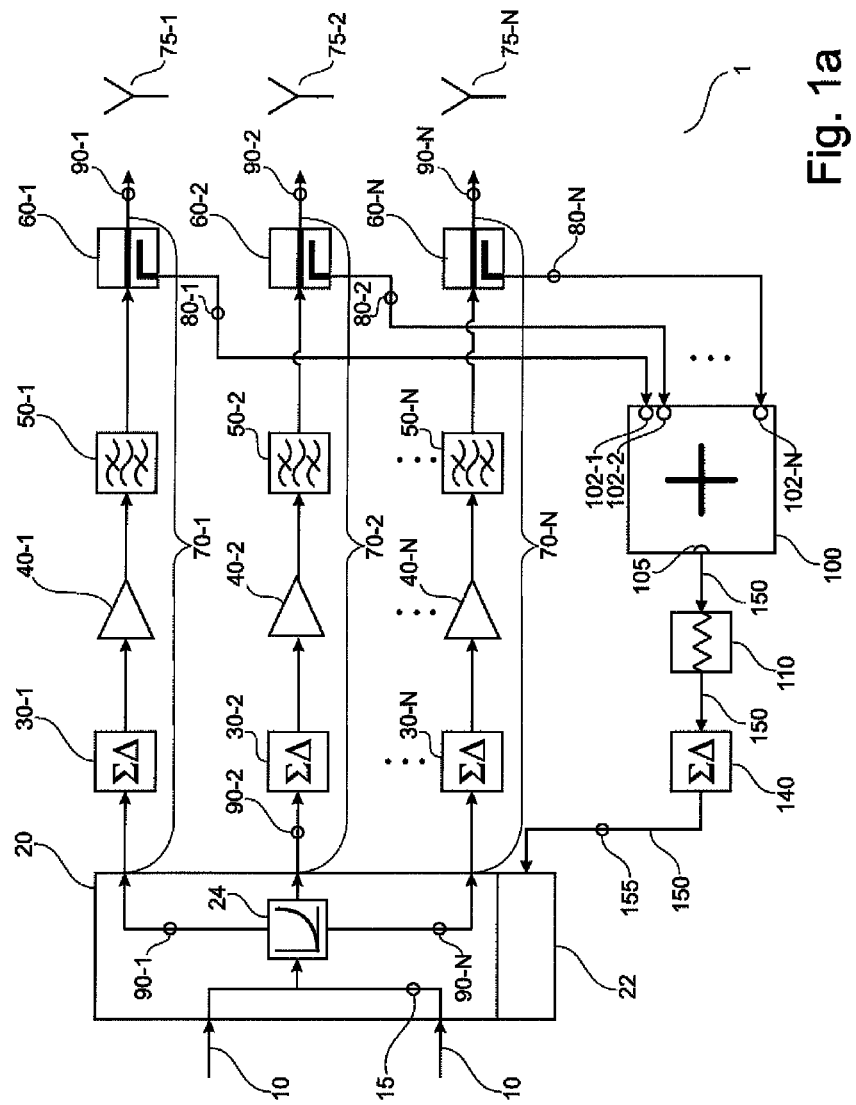
FIG. 1a shows a first aspect of a radio station according to the present disclosure.

FIG. 1a shows a first aspect of a radio station 1 according to the present disclosure. An input stage 10 is adapted to accept a payload signal 15. The payload signal 15 is forwarded to a digital predistortion module 20. The digital predistortion module 20 may be implemented as a digital signal processor (DSP). The payload signal 15 typically comprises an in phase portion and an out of phase portion, i.e. a quadrature portion (I, Q). The input data 15 may be provided in a digital format. The digital formats for the payload signal 15 in an (I, Q) format are known in the art and will not be explained any further. Alternatively or additionally it is possible for the input signal 15 to be provided as pairs of amplitude and phase values (A, P). The payload signal 15 is not changed by the selected form of the payload signal 15 i.e. (I,Q) or pairs of phase and amplitude (A, P).

The radio station 1 as shown in FIG. 1a comprises at least one transmit path 70-1, 70-2, ..., 70-N. There are three different transmit paths 70-1, 70-2, 70-N displayed within FIG. 1a. Obviously, different numbers of the transmit paths 70-1, ..., 70-N are conceivable. Each one of the transmit paths 70-1, ..., 70-N is terminated by an antenna element 75-1, 75-2, ..., 75-N. For a digital predistortion 24 to be imposed on the payload signal 15, as is disclosed within this document, the antenna elements 75-1, ..., 75-N terminating the transmit paths 70-1, ..., 70-N are not critical. Hence, the antenna elements 75-1, ..., 75-N are only shown in FIG. 1a.

Figure 5A:
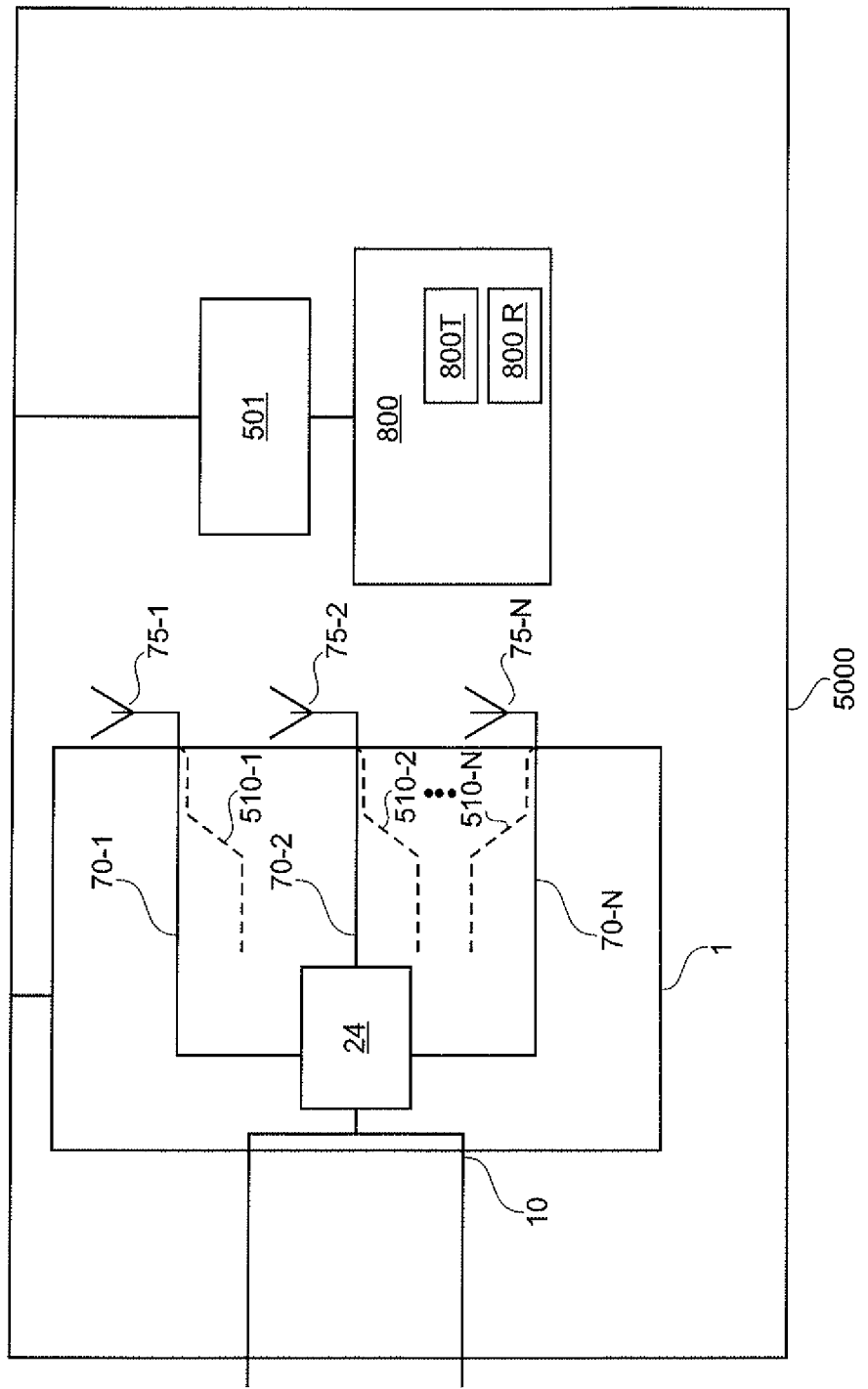
FIG. 5a shows a block diagram of another aspect of the active antenna array according to the present disclosure.

The radio station 1 is adapted to relay radio signals. The radio signals can be in the form of the payload signal 15 to be transmitted along the transmit paths 70-1, ..., 70-N of the radio station 1. The radio station 1 typically is further adapted to receive a receive signal. As predistortion deals with non-linearities in a transfer characteristics of the transmit paths 70-1, ..., 70-N, the receive portion of the radio station 1 is shown in FIG. 5a only, but not within FIGS. 1a-3.

The radio station 1 adapted to transmit and receive signals may further comprise two different sets of antenna elements. A first set of the two sets of the antenna elements being used as the antenna elements 75-1, ..., 75-N terminating the transmit paths 70-1, ..., 70-N. A second set of the antenna elements is used for reception of a receive signal. The second set of the antenna elements may be exclusively used for the reception of the receive signal. Alternatively, it is possible to use the antenna elements 75-1, ..., 75-N terminating the transmit paths 70-1, ..., 70-N for both the transmission and the reception of the radio signals. Alternatively, antenna elements 75-1, ..., 75-N can also represent antenna sub-arrays instead of single elements. For example, a two-element sub-array for each transmit path might be interesting for overall cost reductions as less transmit paths 70-1, ..., 70-N are required for a given number of the antenna elements 75-1, ..., 75-N.

For the radio station 1 comprising one set of the antenna elements 75-1, ..., 75-N used for both, transmission and reception, the transmit path 70-1, ..., 70-N would be in the form of a transceiver path. The transceiver path comprises a transmit portion of the transceiver path and a receive portion of the transceiver path. The transmit portion corresponds to the transmit path 70-1, ..., 70-N as shown within FIG. 1a. The receive portion of the transceiver path typically branches out from a separation device (not shown), for example a circulator or an appropriate filter and the like, as known in the art. The separation device directs received signals from the antenna elements 75-1, ..., 75-N to the receive portion 510-1, 510-2, ..., 510-N (see FIG. 5a) of the transceiver path. The transmit signal 90-1, 90-2, ..., 90-N travelling along the transmit portion of the transceiver path, i.e. the transmit path 70-1, ..., 70-N, are directed towards the antenna elements 75-1, ..., 75-N for transmission.

It will be apparent for a person skilled in the art that the concept described for the transmit paths 70-1, ..., 70-N also holds true in the case of the transmit portion of the transceiver paths; in those cases in which the radio station 1 is used for transmission and reception of the radio signals.

The transmit path 70-1, ..., 70-N, as shown in FIG. 1a, comprises a digital-to-analogue converter in the form of a delta-sigma digital-to-analogue converter 30-1, 30-2, ..., 30-N.

It is possible for the radio station 1, as described herein, to be implemented on a single chip. For such a setup of the radio station 1, the limiting dimensions of the radio station 1 are substantially determined by dimensions of the antenna elements 75-1, ..., 75-N, i.e. the dimensions of an antenna array 5000, as described below.

The implementing of the radio station 1 on the single chip may substantially reduce the hardware costs for the radio station 1, as no further space is needed separated from the antenna elements to house RF equipment. The RF equipment comprises for example an RF amplifier needing space and cooling power. The implementation of the radio station 1 on a chip further omits difficulties introduced by cable connections from a base portion of the radio station 1 to a top portion of the radio station 1 where the antenna elements 75-1, ..., 75-N are located. It is known that phase differences occur between signals carried on the cable connections. The phase differences of the signals on the cable connections will result in phase differences between signals transmitted by individual ones of the antenna elements 75-1, ..., 75-N as intended in connection with the beam steering techniques.

In the prior art, the individual ones of the cable connections may require calibration in order to compensate for the phase differences introduced by the cable connections. This calibration of the cable connections is time consuming. Further, the calibration of the cable connections may change when altering the cable connections, such as replacing a selected one of the cable connections that has been damaged. The implementing of the radio station 1 on a single chip omits these difficulties introduced by the cable connections.

The transmit path 70-1, ..., 70-N further comprises an amplifier 40-1, 40-2, ..., 40-N as well as a filter 50-1, 50-2, ..., 50-N and a coupler 60-1, ..., 60-N. The transfer characteristics of the amplifiers 40-1, ..., 40-N are typically designed to be as identical as possible for the radio station 1 comprising several transmit paths 70-1, ..., 70-N. Typically a group of the amplifiers 40-1, ..., 40-N is fabricated in a single batch. The use of the amplifiers 40-1, ..., 40-N belonging to the single batch increases the likelihood of the amplifiers 40-1, ..., 40-N having substantially identical characteristics. The position of the filter 50-1, ... 50-N may be before or after the coupler 60-1, ... 60-N.

The filter 50-1, ..., 50-N may be any filter adapted to appropriately filter the transmit signal 90-1, ..., 90-N amplified by the amplifier 40-1, ..., 40-N. In case of a combined transmit and receive path, the transmit portion of the transceiver path could branch out from the filter element 50-1, ..., 50-N, as is known in the art. Typically, the filter 50-1, ..., 50-N comprises a band pass filter. The filter 50-1, ..., 50-N allows the transmit signal 90-1, ..., 90-N to pass the filter 50-1, ..., 50-N in a group of frequency bands or channels as defined by the communication standard, such as for example 3GPP.

The transmit path 70-1, ..., 70-N further comprises the coupler 60-1, 60-2, ..., 60-N. The coupler 60-1, ..., 60-N is adapted to extract a portion of the transmit signal 90-1, ..., 90-N as a coupled transmit signal 80-1, 80-2, ..., 80-N out of the transmit path 70-1, ..., 70-N. The coupler 60-1, ..., 60-N is known in the art and may for example comprise a circulator. Obviously any other form of coupler 60-1, ..., 60-N is appropriate for use with the present disclosure, provided the coupler 60-1, ..., 60-N allows the extraction of a coupled transmit signal 80-1, ..., 80-N out of the transmit signal 90-1, ..., 90-N. The coupled transmit signals 80-1, ..., 80-N are forwarded to a combiner 100.

The combiner 100 comprises a plurality of combiner inputs 102-1, ..., 102-N and one combiner output 105. The combiner 100 is adapted to add a plurality of input signals, in FIG. 1a the coupled transmit signals 80-1, ..., 80-N, at the combiner inputs 102-1, ..., 102-N with a defined phase angle between individual ones out of the coupled transmit signals 80-1, ..., 80-N. The addition carried out by the combiner 100 is phase coherent as a defined phase relation between the coupled transmit signals 80-1, ..., 80-N is maintained. The combiner 100 may be a discrete unit or modelled using a mathematical description.

The defined phase angle between individual ones of the coupled transmit signals 80-1, ..., 80-N should be maintained over a frequency range of transmission of the radio station 1. Typically, the frequency range of transmission of the radio station 1 is defined by the communication standard. The signal path for the coupled transmit signals 80-1, ..., 80-N from the couplers 60-1, ..., 60-N to the combiner 100 is substantially not introducing too much of a phase difference between the individual ones of the coupled transmit signals 80-1, ..., 80-N arriving at combiner inputs 101-1,

101-2, ..., 101-N. If the introduced phase differences between the individual ones of the coupled transmit signals 80-1, ..., 80-N was too big, the addition carried out by the combiner 100 would no longer be a true representation of all the coupled transmit signals 80-1, ..., 80-N arriving at the combiner inputs 102-1, ..., 102-N.

In FIG. 1a it is assumed that the coupled transmit signals 80-1, ..., 80-N substantially have an identical power level. Providing the coupled transmit signals 80-1, ..., 80-N of the substantially identical power level at the combiner inputs 102-1, ..., 102-N yields an equal weighting of the coupled transmit signals 80-1, ..., 80-N when added by the combiner 100.

In other words, the nonlinearities occurring within individual ones of the amplifiers 40-1, ..., 40-N will equally be represented within a composite or common feedback signal 155 leaving the combiner 100. If the power level of the coupled transmit signals 80-1, ..., 80-N is not substantially identical when arriving at the combiner 100, it is possible to alter a product of a power rating of the amplifier 40-1, ..., 40-N and a coupling strength of the coupler 60-1, ..., 60-N. The altering of the product of the power rating of the amplifier 40-1, ..., 40-N and the coupling strength of the coupler 60-1, ..., 60-N may be achieved by a variable attenuator 81-1, ..., 81-N, as will be explained with respect to FIGS. 3a and 3b.

For the situation depicted in FIG. 1a the product of the power ratings of the amplifiers 40-1, ..., 40-N and the coupling strength of the couplers 60-1, ..., 60-N is assumed to be identical for the individual ones of the transmit paths 70-1, ..., 70-N.

The common feedback signal 155 is fed into a common feedback path 150 leading from the combiner output 105 to a digital predistortion update module 22 of the digital predistortion module 20.

The provision of a single common feedback path 155 reduces complexity and hardware costs of the radio station 1. The common feedback path 150 comprises an attenuator 110. The attenuator 110 serves to reduce the power level of the common feedback signal 155. The attenuator 110 may be useful to ensure that the common feedback signal 155 does not exceed a power rating of the digital predistortion update module 22. It should be noted that the attenuator 110 should possess a substantially linear amplitude and phase transfer characteristic and a flat frequency response over the frequency range of transmission of the radio station 1. The near-ideal characteristics of the attenuator 110 prevents further nonlinearities being introduced into the common feedback signal 155 stemming from the attenuator 110 and the amplifier 40-1, ..., 40-N.

The common feedback path 150 further comprises an analogue-to-digital converter 140. The analogue-to-digital converter 140 shown in FIG. 1a is a delta-sigma analogue-to-digital converter. Any other analogue-to-digital converter 140 may be used. It is convenient to place the analogue-to-digital converter 140 downstream of the attenuator 110. It would as well be possible to place the analogue-to-digital converter 140 up stream from the attenuator 110. Placing the analogue-to-digital converter 140 downstream of the attenuator 110 allows provision of a defined power level of the common feedback signal 155. The defined power level of the common feedback signal 155 may be of interest in order to use a full dynamic range of the analogue-to-digital converter 140, as is known in the art.

The digital predistortion update module 22 is adapted to update the digital predistortion 24 imposed onto the payload signal 15 and hence imposed on the transmit signal 90-1, ..., 90-N travelling along the transmit path 70-1, ..., 70-N. The digital predistortion update module 22 may be implemented using the DSP. The use of the common feedback signal 155 reduces the complexity of the digital predistortion update module 22. In case of the common feedback signal 155 only one of the digital predistortion update modules 22 is needed; which will reduce complexity and hardware cost of the radio station 1 according to the present disclosure.

There may be one or more DSPs used forming the digital predistortion module 20 and the digital predistortion update module 22. Alternatively, for cost saving reasons it may be of interest to implement the digital predistortion module 20 and the digital predistortion update module 22 on the same DSP, reducing the hardware complexity and costs of the radio station 1 further.

The digital predistortion 24 may be represented as a lookup table or a table of polynominal coefficients describing the nonlinearity of the digital predistortion 24. The digital predistortion update module 22 is adapted to compare the common feedback signal 155 with the (delayed) payload signal 15. Subsequently, the digital predistortion update module 22 is adapted to extract the nonlinearities between the common feedback signal 155 and the payload signal 15 and to adjust the digital predistortion 24, if necessary.

It should be noted that the radio station 1 requires only one digital predistortion 24 to be imposed onto the payload signal 15. The radio station 1 may therefore reduce system complexity and hardware costs.

The radio station 1 facilitates the process of updating the digital predistortion 24 using the digital predistortion update module 22. It is only required to compare the common feedback signal 155 with the payload signal 15. In a system according to the prior art it would either be necessary to compare individual ones of the coupled transmit signals 80-1, ..., 80-N to the (delayed) payload signal 15. The process of updating the digital predistortion 24 is in the prior art, more time consuming. It would further be necessary to provide individual digital predistortions 24 for each one of the transmit paths 70-1, ..., 70-N. Hence, the radio station 1 of the disclosure speeds up the process of updating the digital predistortion 24 and reduces hardware requirements at the same time.

It is apparent to a person skilled in the art that the phase angle imposed between individual ones of the coupled transmit signals 80-1, ..., 80-N by the combiner 100 needs to be carefully selected. The phase angle between the individual ones of the coupled transmit signals 80-1, ..., 80-N within the common feedback signal 155 depends on the phase angle imposed by the combiner 100 as well as on the phase angles between individual ones of the transmit paths 70-1, ..., 70-N. It should be prevented for pairs out of the coupled transmit signals 80-1, ..., 80-N within the common feedback signal 155 to yield a phase angle of 180 degrees or close to 180 degrees. The phase angle close to 180 degrees would cause a destructive interference of the pair of coupled signals 80-1, ..., 80-N within the common feedback signal 155.

The destructive interference for the pair of coupled signals 80-1, ..., 80-N, would make the common feedback signal 155 no longer an appropriate representation of all the coupled transmit signals 80-1, ..., 80-N. Consequently, the nonlinearities accumulated along the transmit paths 70-1, ..., 70-N would not be represented in their entirety within the common feedback signal 155. Accordingly, for the pairs of the coupled signals 80-1, ..., 80-N with the phase angle close to 180 degrees, the common feedback signal 155 would not allow the digital predistortion 24 to correct for all the nonlinearities accumulated along all of the transmit paths 70-1, ..., 70-N.

For the radio station 1 comprising the antenna elements 75-1, ..., 75-N the phase angle between individual ones of the antenna elements 75-1, ..., 75-N is known. The phase angle between the individual ones of the combiner inputs 102-1, ..., 102-N are also well known. Techniques such as beam steering, down tilting and the like change the respective phase angle between the individual ones of the antenna elements 75-1, ..., 75-N in a controlled way.

During any instant of normal operation of the radio station 1 the phase angle between the individual ones out of the coupled transmit signals 80-1, ..., 80-N within the common feedback signal 155 can be estimated. For the phase angle between the individual ones of the coupled transmit signals 80-1, ..., 80-N within the common feedback signal 155 approaching 180 degrees, an active decoupling circuit may be used to actively suppress one out of the two coupled transmit signals 80-1, ..., 80-N in order to remove the unwanted phase angle close to 180 degrees between the coupled transmit signals 80-1, ..., 80-N within the common feedback signal 155.

For the digital predistortion 24 to correctly represent the nonlinearities for all of the transmit paths 70-1, ..., 70-N, the digital predistortion 24 needs two or more iterations to update the digital predistortion 24 in the case of the phase angle between the individual ones of the coupled transmit signals 80-1, ..., 80-N within the coupled feedback signal 155 approaching 180 degrees, as explained below.

Figure 1B:
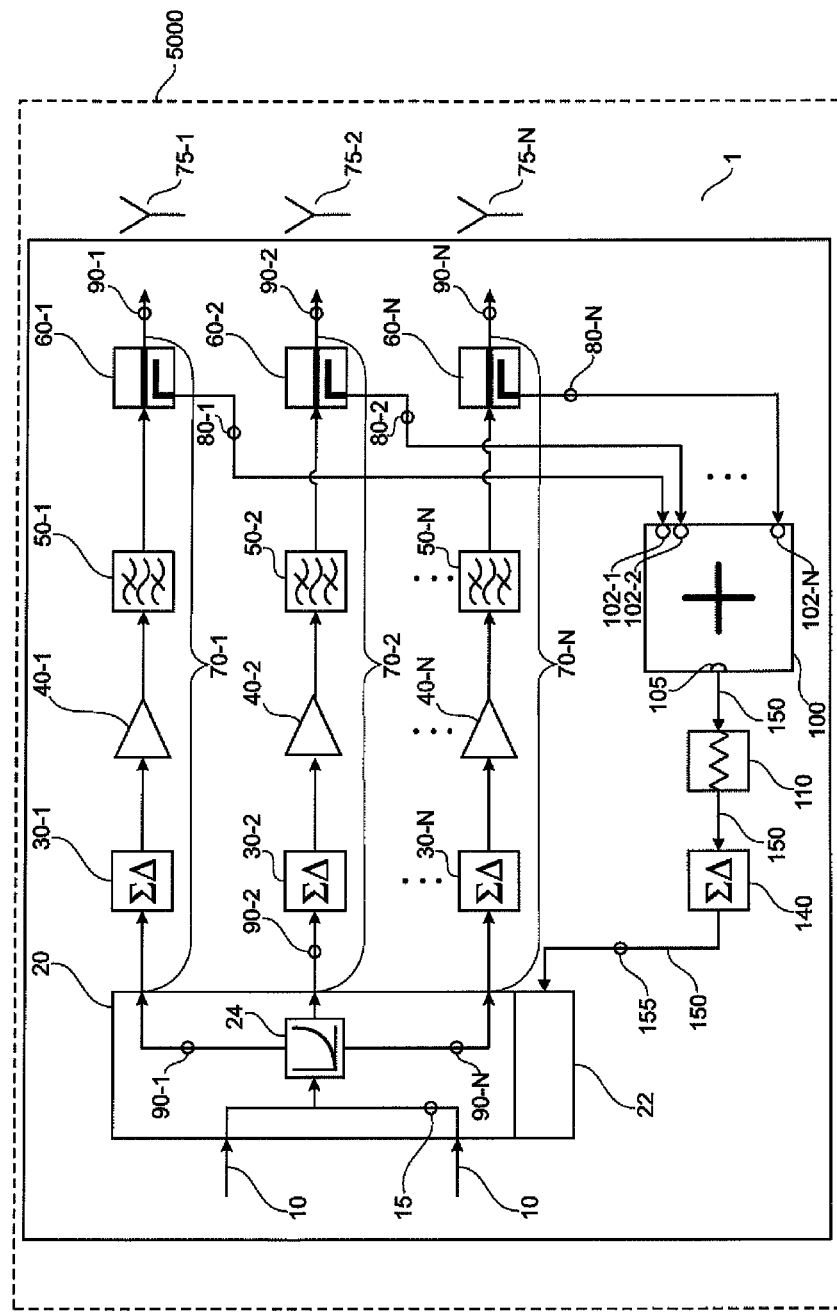
FIG. 1b shows an aspect of an antenna array according to the present disclosure.

FIG. 1*b* shows an aspect of the active antenna array 75-1, ..., 75-N comprising a radio station 1 according to the teachings disclosed herein and a signal conditioner. The radio station 1 is implemented on a chip, wherein the overall dimensions of the active antenna array 75-1, ..., 75-N as well as the overall dimensions of the radio station 1 are substantially governed by the dimensions of the active antenna array 5000, i.e. all the antenna elements 75-1 ..., 75-N of the active antenna array 5000.

Figure 2:
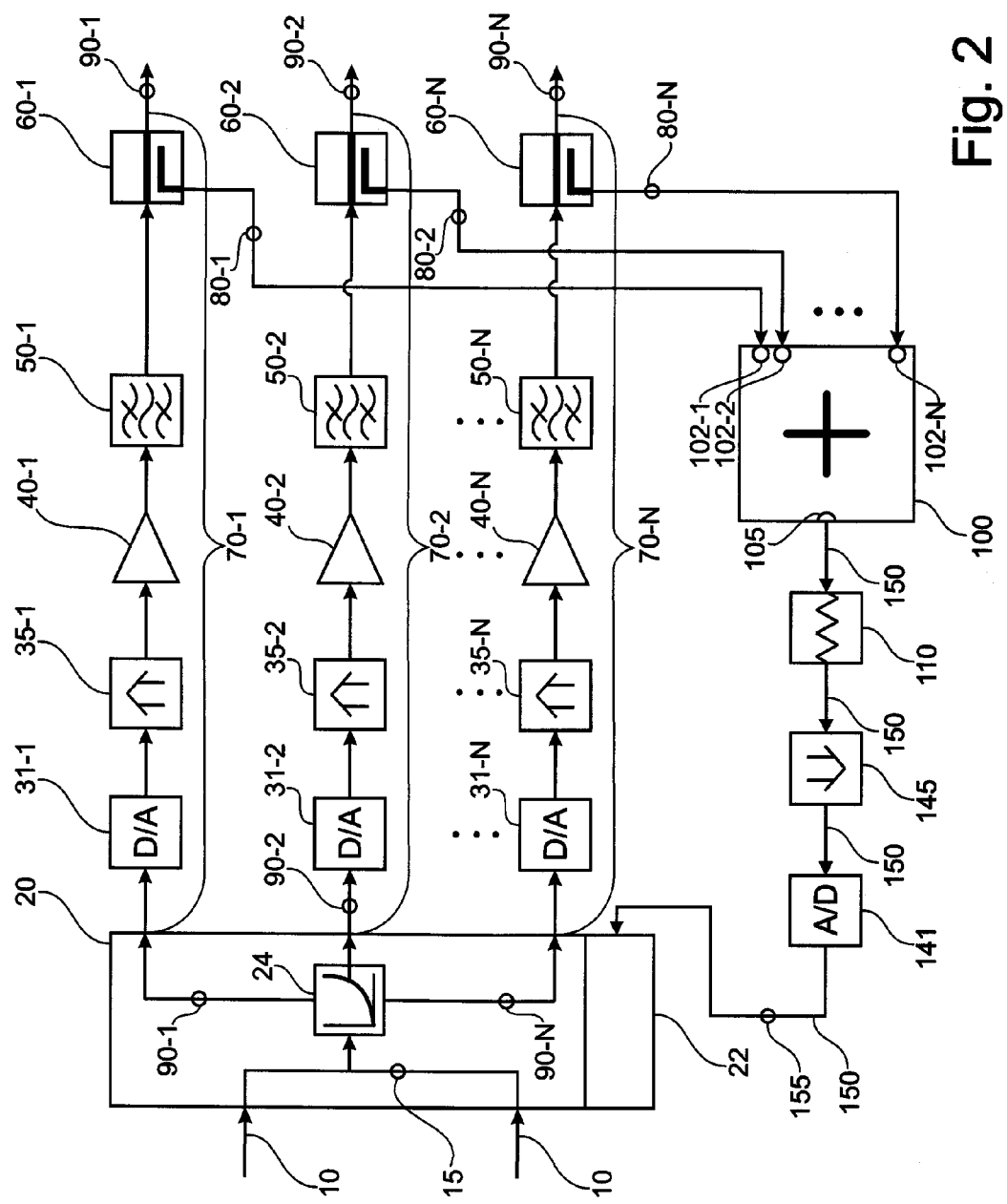
FIG. 2 shows a further aspect of the radio station according to the present disclosure.

FIG. 2 shows an alternative aspect of the radio station 1. The alternative aspect of the radio station 1 of FIG. 2 differs from FIG. 1*a*, 1*b* in that digital-to-analogue converters 31-1, 31-2, ..., 31-N within FIG. 2 replace the delta-sigma digital-to-analogue converters 30-1, ..., 30-N. The delta-sigma digital-to-analogue converters 30-1, ..., 30-N shown in FIG. 1*a*, 1*b* do not require an up converter 35-1, 35-2, ..., 35-N as is needed with the digital-to-analogue converters 31-1, ..., 31-N shown in FIG. 2. The up converters 35-1, ..., 35-N are known in the art and will not be discussed further within this disclosure. It will be apparent to a person skilled in the art that the use of the delta-sigma digital-to-analogue converters 30-1, ..., 30-N is of interest in order to reduce the system complexity of the radio station 1; as the up converters 35-1, ..., 35-N are no longer needed.

A further difference of FIG. 2 is the presence of an analogue-to-digital converter 141 together with a down converter 145 replacing the delta-sigma analogue-to-digital converter 140 shown in FIG. 1. The presence of the delta-sigma analogue-to-digital converters 140 instead of the analogue-to-digital converter 141 and the down converter 145 is of interest in order to reduce the complexity of the radio station 1. Nevertheless, a person skilled in the art will appreciate that the delta-sigma analogue-to-digital converters 30-1, ..., 30-N and the analogue-to-digital converters 31-1, ..., 31-N in combination with the up converters 35-1, ..., 35-N can be interchanged or used in combination. All remaining elements of FIG. 2 have already been discussed with respect to FIG. 1. Identical items are given identical reference numbers. The antenna elements 75-1, ..., 75-N are not shown on FIG. 2.

Figure 3A:
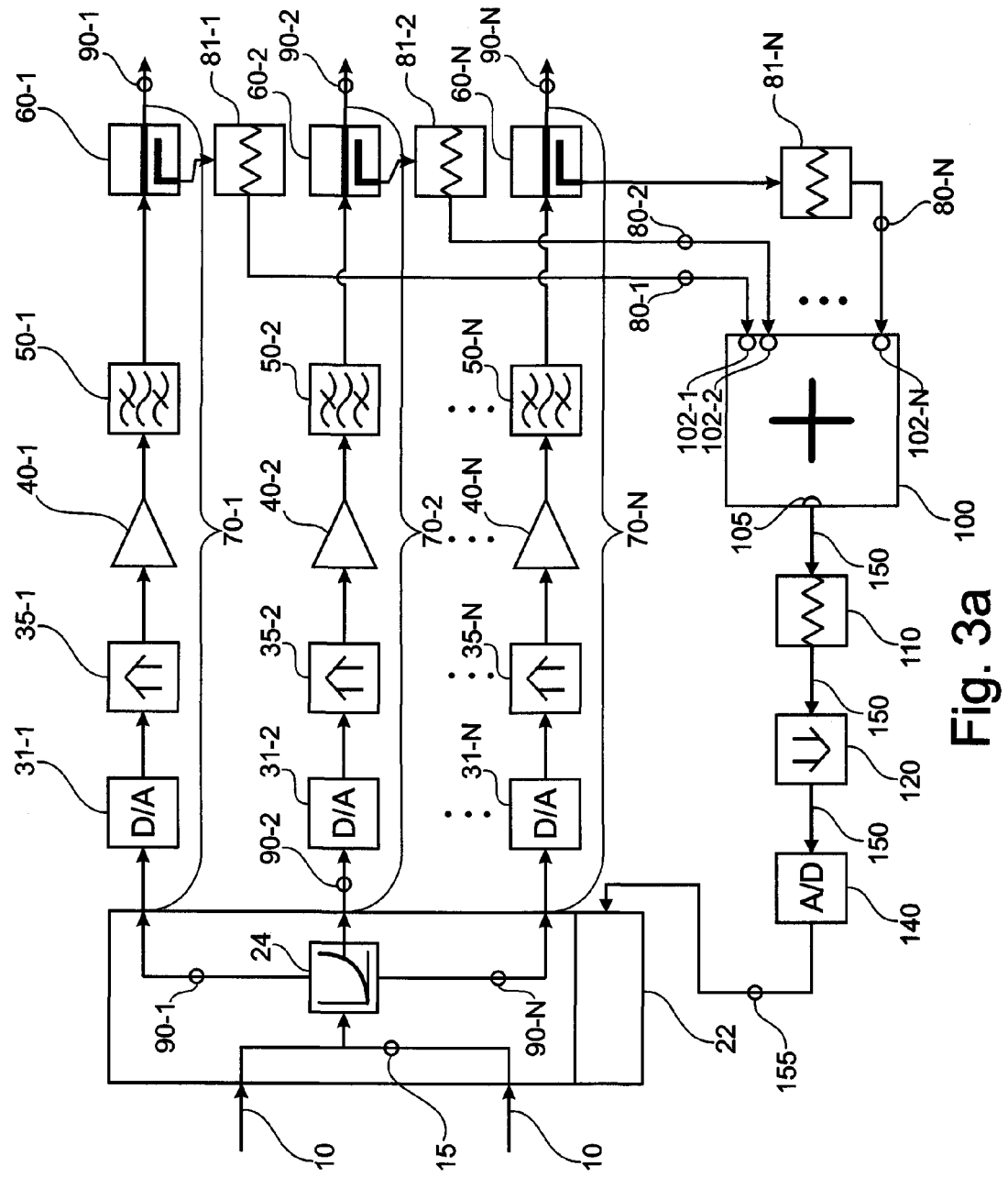
FIG. 3a shows yet another aspect of the radio station according to the present disclosure.

FIG. 3*a* shows a further aspect of the radio station 1. In addition to the elements already discussed on FIG. 1*a*, 1*b* and FIG. 2, the radio station 1 comprises an attenuator 81-1, 81-2, ..., 81-N downstream of the couplers 60-1, ..., 60-N. The attenuators 81-1, ..., 81-N are actually implemented as adjustable attenuators. Nevertheless fixed attenuators are also conceivable in place of the adjustable attenuators 81-1, ..., 81-N. The attenuators 81-1, ..., 81-N are of interest when the transmit paths 70-1, ..., 70-N have different power ratings. It is a fairly common situation for the transmit paths 70-1, ..., 70-N and hence the antenna elements 75-1, ..., 75-N terminating the transmit paths 70-1, ..., 70-N to transmit radiation of different power ratings. The antenna elements 75-1, ..., 75-N are typically arranged in horizontal rows and vertical columns.

Figure 3B:
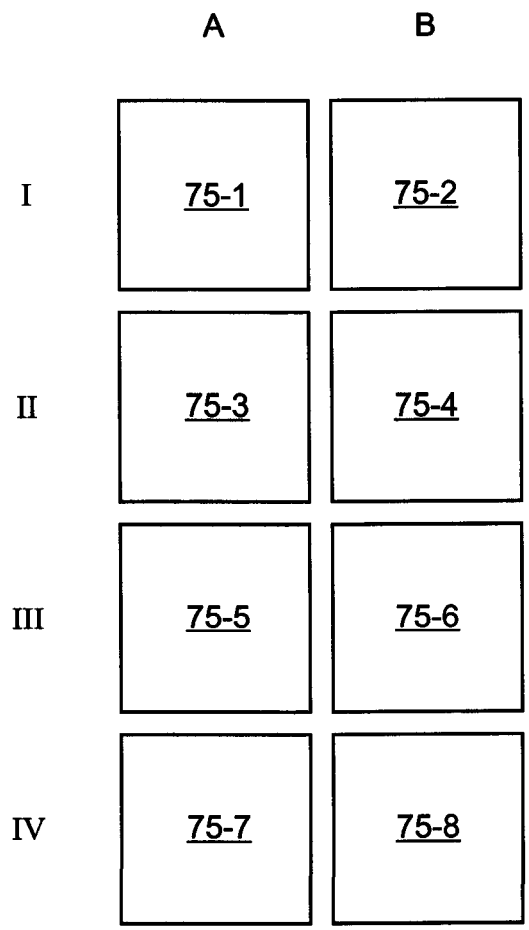
FIG. 3b shows an example of eight antenna elements arranged in two columns (A and B) and four rows (I, II, III and IV).

FIG. 3*b* shows an example of an arrangement of eight antenna elements 75-1, ..., 75-N in a two by four arrangement. In FIG. 3*b* there are two vertical columns A and B and four horizontal rows I to IV of the antenna elements 75-1, 75-2, 75-3, 75-4, 75-5, 75-6, 75-7 and 75-8. The antenna elements 75-1, ..., 75-8 are depicted as rectangular and shall be construed as non-limiting examples. As is known to a person skilled in the art other geometries and/or types of the antenna elements 75-1, ..., 75-N are conceivable. Examples for possible geometries and/or types are: circular, elliptical, micro-strips, dipoles and the like. The antenna elements 75-1, ..., 75-N are typically decoupled from each other. The decoupling may be achieved by a geometrical decoupling, i.e. an overlap of individual ones of the antenna elements 75-1, ..., 75-N. Alternatively or additionally the decoupling may be achieved by appropriate decoupling networks. The appropriate decoupling networks commonly comprise PIN diodes. The decoupling is known to a person skilled in the art and will not be explained any further. The decoupling is not shown with FIGS. 1*a*, 1*b*, 2, 3*a* and 3*b*.

The central antenna elements 75-3, 75-4, 75-5 and 75-6 in FIG. 3*b* (i.e. in horizontal lines II and III) could transmit with a power rating of 10 Watts; whereas the outer antenna elements (i.e. horizontal lines I and IV) only transmit with a power rating of 4 Watts. The attenuators 81-1, ..., 81-N (FIG. 3*a*) are adapted to assure that the coupled transmit signals 80-1, ..., 80-N reaching the combiner inputs 101-1, ..., 101-N are of a substantially identical power rating.

The attenuators 81-1, ..., 81-N are adapted to assure that the product of the power rating of the amplifier 40-1, ..., 40-N and the coupling strength of the coupler 60-1, ..., 60-N are made substantially identical. This may be of interest when the couplers 60-1, ..., 60-N have different coupling strengths. The term "substantially identical power rating" shall be construed as referring to the substantially identical product of the power rating of the amplifiers 40-1, ..., 40-N and the coupling strength of the couplers 60-1, ..., 60-N, as defined above.

The substantially identical power rating would allow all of the coupled transmit signals 80-1, ..., 80-N to be represented with substantially equal magnitude within the common feedback signal 155. Nevertheless, a pair of the coupled transmit signals 80-1, ..., 80-N may yield a phase angle close to 180 degrees causing a destructive interference of the pair of the coupled signals 80-1, ..., 80-N, as will be explained further down.

If the power rating of the transmit path 70-1 is four times higher than, for example, the power rating of the $N^{th}$-transmit path 70-N, the attenuator 81-1, downstream of the coupler 60-1 would attenuate the coupled feedback signal 80-1 four times more than the attenuator 81-N downstream of the coupler 60-N to achieve the substantially identical power level across all the coupled feedback signals 80-1, ..., 80-N at the combiner entries 101-1, ..., 101-N.

If the power rating of the transmit paths 70-1, ..., 70-N is substantially identical for all the transmit paths 70-1, ..., 70-N, the attenuators 81-1, ..., 81-N may be omitted. Nevertheless, it may be of interest to provide the attenuators 81-1, ..., 81-N even for the radio station 1 with the substantially identical power rating for all the transmit paths 70-1, ..., 70-N.

There may be one or more pair(s) of the coupled transmit signals 80-1, ..., 80-N yielding a phase angle close to 180 degrees, even in the example in which the power rating of the amplifiers 40-1, ..., 40-N is substantially identical. The phase angle close to 180 degrees would cause the destructive interference of the pair(s) of the coupled transmit signals 80-1, ..., 80-N within the common feedback signal 155.

Suppose, the coupled transmit signals 80-1, ..., 80-N within the common feedback signal 155 comprise the pair(s) of the coupled transmit signals 80-1, ..., 80-N with the phase angle close to 180 degrees. The pair(s) of the coupled transmit signals 80-1, ..., 80-N would not be visible within the common feedback signal 155 due to the destructive interference. It would be possible to increase the attenuation of a selected one of the attenuators 81-1, ..., 81-N. Increasing the attenuation of the selected one of the attenuators 81-1, ..., 81-N will eventually suppress a selected one of the coupled transmit signals 80-1, ..., 80-N of the pair(s) of the coupled transmit signals 80-1, ..., 80-N with the phase angle close to 180 degrees. The remaining one of the pair(s) of the coupled transmit signals 80-1, ..., 80-N—previously yielding the phase angle close to 180 degrees—will now be equally represented within the common feedback signal 155.

The use of the decoupling networks, for example comprising PIN diodes (not shown), to decouple individual ones of the antenna elements 75-1, ..., 75-N also allows for a suppression of an individual one of the transmit signals 90-1, ..., 90-N and hence a suppression of an individual one of the pair(s) of coupled transmit signals 80-1, ..., 80-N. The decoupling networks would also allow the suppression of at least one of the pair(s) of the coupled transmit signals 80-1, ..., 80-N yielding the phase angle close to 180 degrees. Unfortunately the use of the decoupling networks, i.e. the PIN diodes, interferes with the normal operation of the radio station 1 when suppressing the selected one of the coupled feedback signals 80-1, ..., 80-N yielding the phase angle close to 180 degrees within the common feedback signal 155.

The attenuators 81-1, ..., 81-N allow the suppression of the selected one of the coupled transmit signals 80-1, ..., 80-N without interfering with the normal operation of the radio station 1. Hence the attenuators 81-1, ..., 81-N allow for updating the digital predistortion 24 imposed on the payload signal 15 without affecting the functionality of the radio station 1 by selectively attenuating one of the coupled transmit signals 80-1, ..., 80-N in order to rule out the phase angle close to 180 degrees for the pair(s) of the coupled transmit signals 80-1, ..., 80-N within the common feedback signal 155.

It will be appreciated by a person skilled in the art that the attenuators 81-1, ..., 81-N shown in FIG. 3a may also be used in the aspects of the radio station 1 shown in FIGS. 1a, 1b and 2.

The disclosure further relates to a method for digitally predistorting a payload signal 15 to linearise a transfer characteristic of the transmit paths 70-1, ..., 70-N.

Figure 4A:
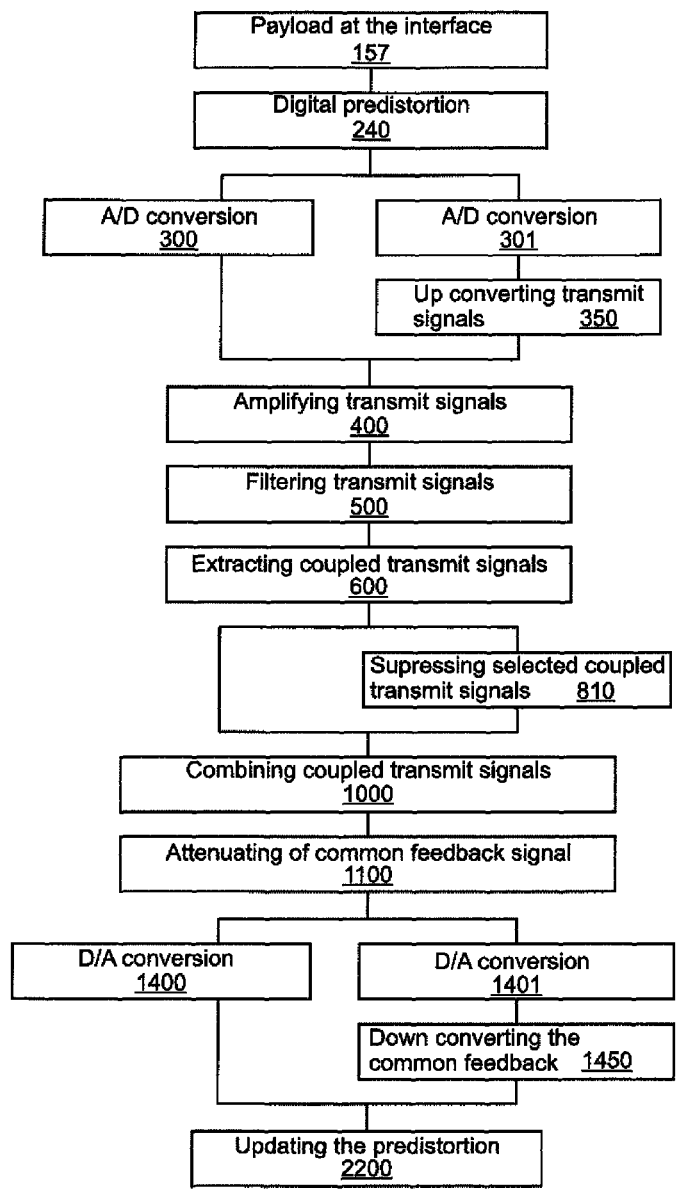
FIG. 4a shows a method for digitally predistorting a payload signal according to the present disclosure.

FIG. 4a shows a block diagram of the method for digitally predistorting the payload signal 15. A step 157 comprises the payload signal 15 at an input interface 10. A common way of representing the payload signal 15 is in pairs of the in-phase portions and the quadrature portions (I,Q). Typically, the input interface 10 is adapted to accept the payload signal 15 in the (I,Q) format. It is conceivable for the payload signal 15 to be represented at the input interface 10 in any other suitable format.

A step 240 comprises imposing a digital predistortion 24 onto the payload signal 15. The payload signal 15 is the intended signal to be relayed as the transmit signal 90-1, ..., 90-N along the transmit paths 70-1 ... 70-N. As explained above, the, imposing 240 of the digital predistortion 24 comprises adding and/or multiplying "the inverse distortion" to the payload signal 15. By imposing the correct digital predistortion 24 onto the payload signal 15, the transmit signal 90-1, ..., 90-N is a correct representation of the transmit signal 15. A most recent one of the digital predistortions 24 used previously could be used as an initial value for the digital predistortion 24 to be imposed onto the payload signal 15. Alternatively and/or additionally an "inversion" of an estimated nonlinearity of the amplifiers 40-1, ..., 40-N could be used as the initial value for the imposing of the digital predistortion 24.

A digitally-to-analog conversion of the transmit signal 90-1, ..., 90-N follows the step 240 of imposing the digital predistortion 24 onto the payload signal 15. In the left branch of the Figure, a step 300 of digitally-to analog conversion comprises using the delta-sigma digital to analogue converters 30-1, ..., 30-N.

The right branch of the diagram comprises a step 301 of digitally-to-analog conversion of the coupled transmit signal 90-1, ..., 90-N using the digital-to-analog converter 31-1, ..., 31-N. The step 301 is followed by a step 350 of upconverting the transmit signal 90-1, ..., 90-N.

The method further comprises an amplification step 400 of amplifying the transmit signal 90-1, ..., 90-N irrespective of the selected way of digitally-to-analog conversion.

A filtering step 500 of filtering the transmit signal 90-1, ..., 90-N is carried out. The filtering step 500 may comprise the use of band pass filters. The band pass filter may comprise a filtering characteristic as defined by the communication protocol.

An extraction step 600 comprises the extraction of a coupled transmit signal 80-1, ..., 80-N out of the transmit path 90-1, ..., 90-N. The extraction step 600 is followed by an optional step 810 of attenuating the coupled transmit signals 80-1, ..., 80-N. This may be of interest for example when the transmit paths 70-1, ..., 70-N comprise the different power ratings, as explained above.

As outlined above, the optional attenuation step 810 may also comprise the suppression of the selected one out of the coupled transmit signals 80-1 ... 80-N, in order to remove the phase angle close to 180 degrees between the pair of the coupled transmit signals 80-1, ..., 80-N within the common feedback signal 155 yielding the phase angle close to 180 degrees. If the phase angle close to 180 degrees is present between the pair of the coupled transmit signals 80-1, ... 80-N within the common feedback signal 155, at least two iterations of the method are needed for updating the digital predistortion 24 for all of the transmit paths 70-1 ... 70-N.

Should more than two of the coupled transmit signals 80-1, ..., 80-N yield the phase angle close to 180 degrees within the common feedback signal 155 more than two iterations of the method would be needed to remove all of the destructive interferences within the common feedback signal 155. During each of the iterations, at least two of the coupled transmit signals 80-1, ..., 80-N need to be concurrently attenuated in the step 810 in order to maintain only the selected one of the coupled transmit signals 80-1, ..., 80-N un-attenuated within the common feedback signal 155.

For each one of the concurrently attenuated coupled transmit signals 80-1, ..., 80-N an iteration of the method is needed, wherein an individual one of the concurrently attenuated transmit signals 80-1, ..., 80-N is the selected one of the coupled transmit signals 80-1, ..., 80-N to be maintained un-attenuated within the common feedback signal 155.

A combining step 1000 comprises combining the coupled transmit signals 80-1, ..., 80-N into the common feedback signal 155. The combining step 100 may be carried out using a combiner 100. The combining step 1000 shall be construed as adding the coupled transmit signals 80-1, ..., 80-N in a phase coherent way. The combiner 100 achieves such a phase coherent adding by providing a given phase angle between individual ones of the coupled transmit signals 80-1, ..., 80-N at the combiner inputs 102-1, ..., 102-N. The combiner 100 provides the common feedback signal 155 at the combiner output 105.

In an attenuation step 1100 an optional attenuating of the common feedback signal 155 may be achieved. The optional attenuation step 1100 may be of interest in order to adapt a power level of the common feedback signal 155 to a power level accepted by the digital predistortion update module 22.

Following the step optional attenuation step 1100 the coupled transmit signals 80-1, ..., 80-N, the common feedback signal 155 are digitized. Depending on the digitizers used the method branches into two alternatives, as shown in the figure.

On the left side a DAC step 1400 of analogue-to-digital conversion or digitizing is carried out by the delta-sigma analogue to digital converter 141 (as shown in FIG. 1a or FIG. 1b). On the right side of the diagram a DAC step 1401 of analogue-to-digital conversion is carried out using the analogue-to-digital converter 140. Subsequently, the DAC step 1401 is followed by a down conversion step 1450 of down converting the common feedback signal 155, as is known in the art.

The use of the delta-sigma converters reduces the complexity of the radio system 1. The down converter 120 is no longer necessary when the delta-sigma converter 140 replaces the analogue to digital converter 141. Consequently, the down converting 1450 is no longer needed, as shown in the left branch of FIG. 4a. The method is followed by a step 2200 of updating the digital predistortion 24, once the step of digitizing has been successfully completed.

Figure 4B:
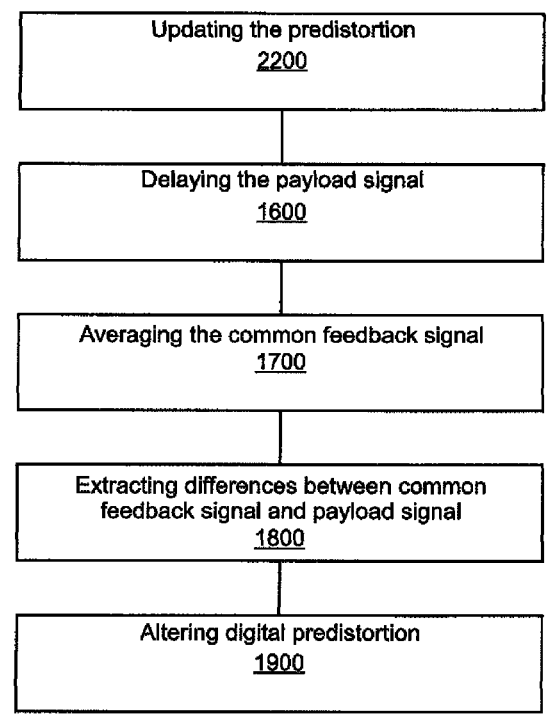
FIG. 4b shows an updating of the digital predistorting according to the method of the present disclosure.

An updating step 2200 of updating the predistortion 24 is illustrated in FIG. 4b. The updating step 2200 comprises an optional delay step 1600 of delaying the payload signal 15. A delay is to be chosen in order to compensate for the travelling time of the transmit signal 90-1, ..., 90-N along the transmit path 70-1 ... 70-N and from the coupler 60-1 ... 60-N as the coupled transmit signal 80-1, ..., 80-N to the combiner 100 and further as the common feedback signal 155 to the digital predistortion update module 22.

An optional averaging step 1700 comprises an averaging of the common feedback signal 155 over several samples. In case of the phase angle between the individual ones of the coupled transmit signals 80-1, ..., 80-N within the common feedback signal 155 being close to 180 degrees, each one of the samples is taken during an iteration of the method according to the teachings of this disclosure. To remove the destructive interference of the coupled feedback signals 80-1, ..., 80-N within the common feedback signal 155, the attenuation step 810 needs to be altered as described above.

Alternatively or additionally, the averaging step 1700 may comprise a static averaging. The static averaging comprises accumulating several samples of the common feedback signal 155 while not changing the attenuation in the attenuation step 810 from one iteration of the method to the next. By means of the static averaging the signal to noise ratio of the samples of the common feedback signal 155 will increase, as is known to a person skilled in the art. The increased signal to noise ratio may be of interest in a step 1800 of extracting differences, as is explained next.

An extraction step 1800 comprises an extracting of differences between the common feedback signal 155 and the, possibly delayed, payload signal 15. The extraction step 1800 yields the differences that mainly are introduced due to the nonlinearities of the amplifier 40-1, ..., 40-N. The differences may comprise a difference in amplitude and/or phase between the (delayed) payload signal 15 and the common feedback signal 155. Methods and devices for extracting the differences between two signals are known in the art and shall not be further explained here.

With the extracted difference from the extraction step 1800 an altering step 1900 of altering the digital predistortion 24 is carried out in order to linearise the transfer characteristics of the transmit paths 70-1, ..., 70-N. A single digital predistortion 24 is sufficient in order to linearise the transfer characteristics of all the transmit paths 70-1, ..., 70-N whereby the complexity of the radio station as well as the hardware costs are further reduced.

This single digital predistortion 24 for all of the transmit paths 70-1, ..., 70-N allows the maintenance and/or the update of the digital predistortions to be less complex, less expensive and less time consuming, than the prior art embodiments.

The digital predistortion 24 is, for example, represented as a look up table comprising coefficients representing the shape of the digital predistortion 24. Methods for representing the nonlinearity in terms of the coefficients, such as for example polynomial coefficients are known to a person skilled in the art and shall hence not be explained any further.

As mentioned before, in cases where the phase angle is close to 180 degree between pairs of the coupled transmit signals 80-1 ... 80-N within the common feedback signal 155, a second or several iterations of the method may be necessary for the averaging step 1700, the extraction step 1800 and subsequently the altering step 1900 correctly; in order for the digital predistortion 24 to be usable as a common digital predistortion valid for all the transmit paths 70-1, ..., 70-N. It may be necessary to run the method several times in order for all non-linearities within all of the transmit paths 70-1 ... 70-N to be correctly represented within the common feedback signal 155.

It may seem a drawback of the method according to the disclosure for the phase angle not to be close to odd multiples of 180 degrees between pairs of the coupled transmit signals 80-1, ..., 80-N Nevertheless, the combining step 1000 of combining the coupled transmit signals 80-1 ... 80-N into the common feedback signal 155 is of interest in order to reduce a system complexity and/or time requirements for the updating step 2200 of updating the digital predistortion 24 for all the transmit paths 70-1, ..., 70-N. The phase angle close to 180 degrees (or odd multiples of 180 degrees) may not be as much of a problem for the practical use of the radio station 1.

The disclosure further relates to a computer program product embedded on a computer readable medium. The computer program product comprises executable instructions for the manufacture of the radio station 1 according to the present disclosure.

The disclosure relates to yet another computer program product. The yet another computer program product comprises instructions to enable a processor to carry out the method for digitally predistorting a payload signal 15 according to the disclosure.

The present disclosure further relates to an antenna array 5000 comprising a radio station 1 according to the present disclosure and a signal conditioner 501. The active antenna array 5000 is adapted to perform any one out of beam forming, beam tilting, beam diversity, direction of arrival and the like.

FIG. 5*a* shows the active antenna array 5000 comprising the plurality of antenna elements 75-1 . . . 75-N terminating the transmit paths 70-1 . . . 70-N of the radio station 1 according to the present disclosure. For the radio station 1 only items of relevance for the understanding of the active antenna array 5000 are depicted within FIG. 5*a*. The active antenna array 5000 further comprises a signal conditioner 501. The signal conditioner 501 is adapted to impose phase and magnitude differences 800 between the antenna elements 75-1 . . . 75-N. The phase and magnitude differences 800 comprise a transmit phase and magnitude difference 800T accumulated along the transmit paths 70-1 . . . 70-N. The phase and magnitude differences 800 may further comprise a receive phase and magnitude difference 800R accumulated along at least one receive path 510 1, . . . , 510-N. In FIG. 5*a* only three receive paths 510-1, . . . , 510-N are shown. The signal conditioner 501 may be implemented as a DSP. It is further possible for the signal conditioner 501 to comprise the DSP of the radio station 1. The signal conditioner 501 may be adapted to derive the transmit magnitude and phase deviations 800T accumulated along the transmit paths 70-1, . . . , 70-N of the radio station 1.

The signal conditioner 501 is adapted to impose phase and magnitude differences onto at least two of the transmit paths 510-1, . . . , 510-N. A reception of the active antenna array 5000 substantially comprises a defined phase and magnitude relation between at least one pair of the receive signals.

It is to be understood that the active antenna array 5000 comprising the radio station 1 and the signal conditioner 501 may as well be used to calibrate the transmit paths 70-1, . . . , 70-N of the radio station 1. It is of interest to complete the method of digitally predistorting a payload signal 15 prior to a calibration of the transmit paths 70-1, . . . , 70-N. The nonlinearities of the transmit paths 70-1, . . . , 70-N would render the calibration of the transmit paths 70-1, . . . , 70-N unreliable, if the method of digitally predistorting a payload signal 15 was not completed prior to calibration of the transmit paths 70-1, . . . , 70-N.

The calibration of the transmit paths 70-1, . . . , 70-N is to be carried out for a chosen one of the transmit paths 70-1, . . . , 70-N at a time, different than for the method of digitally predistorting the payload signal 15. The calibration of the chosen one of the transmit paths 70-1, . . . , 70-N requires a feedback signal to travel along the chosen one of the transmit paths 70-1, . . . , 70-N. The feedback signal to travel along the chosen one of the transmit paths 70-1, . . . , 70-N is necessary in order to allow for the transmit phase and magnitude difference 800T of the chosen one of the transmit paths 70-1, . . . , 70-N to be accumulated. The coupled transmit signals 80-1, . . . , 80-N have traveled along individual ones of the transmit paths 70-1, . . . , 70-N.

The common feedback path 155 is suitable for feeding the coupled transmit signals 80-1, . . . , 80-N back to the signal conditioner 501. As mentioned before the DSP used with the digital predistortion module 20 and the DSP used in connection with the signal conditioner 501 may be implemented on a single DSP. If the DSP used in connection with the signal conditioner 501 and the predistortion module 20 are different, appropriate communication means between both entities, i.e. DSPs are provided, in order to render the signal conditioner 501 adapted to deduce the transmit phase and magnitude difference 800T. Hence the feedback of the coupled transmit signals 80-1, . . . , 80-N to the digital predistortion update module 22, as provided by the common feedback path 155, may be sufficient for the signal conditioner 501 to extract the transmit phase and magnitude difference 800T accumulated along the chosen one of the transmit paths 70-1, . . . , 70-N.

As is known in the art the payload signal 15 may be used as a feedback signal when extracting the transmit phase and magnitude difference 800T. Alternatively a dedicated calibration signal may be injected into the payload signal 15 and identified using correlation techniques in order to extract the transmit phase and magnitude difference 800T for the dedicated calibration signal.

It is necessary to assure that the feedback signal comprises only components having actually traveled along the chosen one of the transmit paths 70-1, . . . , 70-N. Therefore it is necessary to sufficiently attenuate all of the transmit paths 70-1, . . . , 70-N except the chosen one. As explained further above the aspect according to FIG. 3*a* comprising the attenuators 81-1, . . . , 81-N is adapted for such an attenuation of all the coupled transmit signals 80-1, . . . , 80-N except the chosen one.

As stated before the signal conditioner 501 is further adapted to impose a phase and magnitude change on at least two of the transmit paths 70-1, . . . , 70-N. The phase and magnitude change imposed can be selected such that the transmission of the active antenna array 5000 substantially comprises a defined phase and magnitude relation between at least one pair of the antenna elements 75-1, . . . , 75-N. The defined phase and magnitude relation can be such that the magnitude and phase relation is defined for all the transmit paths 70-1, . . . , 70-N. In other words, the signal conditioner 501 is adapted to make the transmission of the active antenna array 5000 of a defined phase and magnitude relation in response to the transmit phase and magnitude differences 800T deduced by the signal conditioner 501. To achieve a defined phase and magnitude relation is equivalent to calibrating the transmit paths 70-1, . . . , 70-N.

The defined phase and magnitude relation may be such that the transmission of the active antenna array 5000 is coherent. For a coherent transmission the phase and magnitude changes imposed would just compensate the transmit phase and magnitude differences 800T. Alternatively or additionally the phase and magnitude changes may be chosen to provide a desired beam forming pattern.

The active antenna array 5000 comprising the base station 1 of the present disclosure allows for the dimensions of the active antenna array 5000 to define the global dimensions of the radio station 1. The radio station 1 can be implemented on a chip, wherein the overall dimensions of the active antenna array 5000 as well as the overall dimensions of the radio station 1 are substantially governed by the dimensions of the active antenna array 5000, i.e. all the antenna elements 75-1, . . . , 75-N of the active antenna array 5000.

While various embodiments of the present invention have been described above, it should be understood that they have been presented by way of example, and not limitation. It will be apparent to persons skilled in the relevant arts that various changes in form and detail can be made therein without departing from the scope of the invention. In addition to using hardware (e.g., within or coupled to a Central Processing Unit ("CPU"), microprocessor, microcontroller, digital signal processor, processor core, System on Chip ("SOC"), or any other device), implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modelling, simulation, description and/or testing of the apparatus and methods described herein. For example, this can be accomplished through the use of general programming languages (e.g., C, C++), hardware description languages (HDL) including Verilog HDL, VHDL, and so on, or other available programs. Such software can be disposed in any known computer usable medium such as semiconductor, magnetic disk, or optical disc (e.g., CD-ROM, DVD-ROM, etc.). The software can also be disposed as a computer data signal embodied in a computer usable (e.g., readable) transmission medium (e.g., carrier wave or any other medium including digital, optical, or analogue-based medium). Embodiments of the present invention may include methods of providing the apparatus described herein by providing software describing the apparatus and subsequently transmitting the software as a computer data signal over a communication network including the Internet and intranets.

It is understood that the apparatus and method described herein may be included in a semiconductor intellectual property core, such as a microprocessor core (e.g., embodied in HDL) and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

Figure 5B:
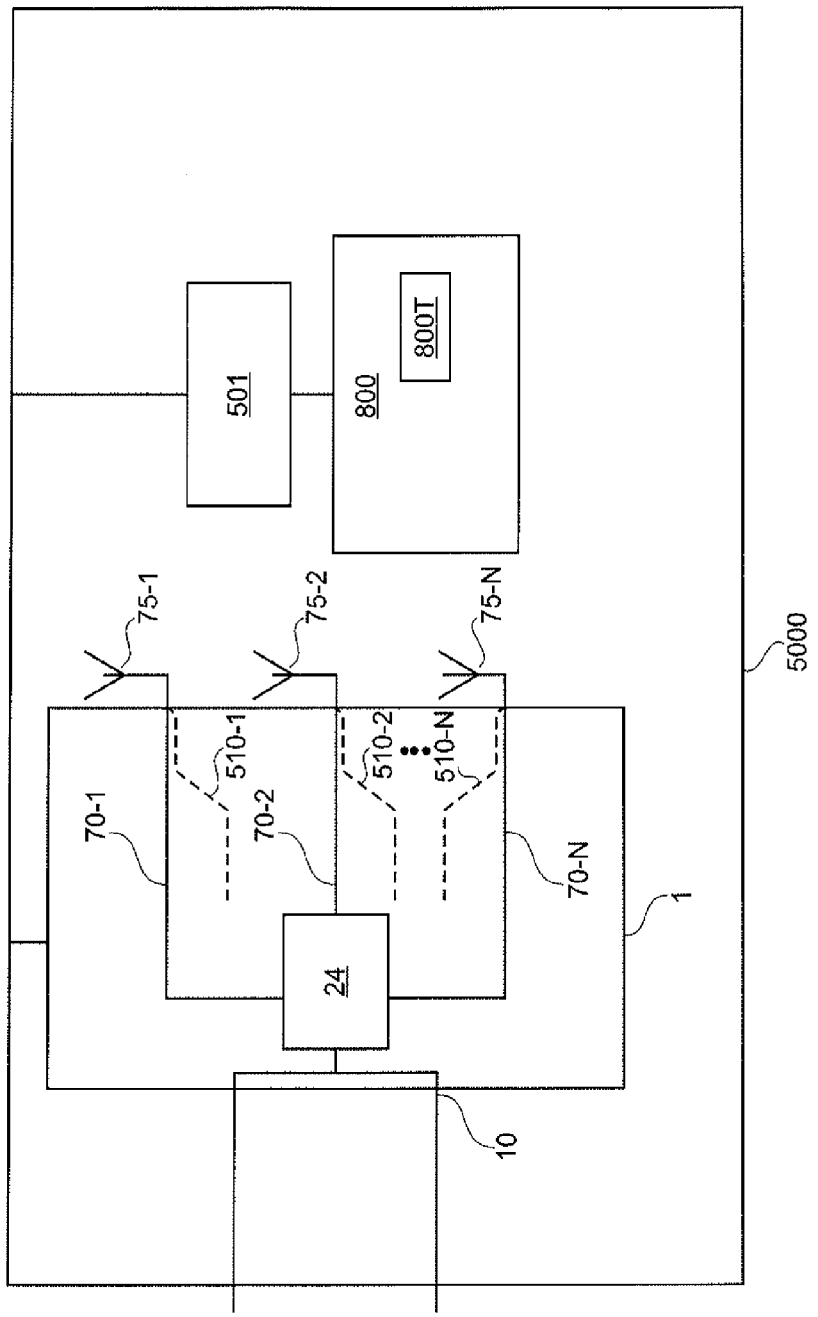
FIG. 5b shows a block diagram of yet another aspect of the active antenna array according to the present disclosure.

FIG. 5b shows a block diagram of yet another aspect of the active antenna array 5000 comprising the plurality of antenna elements 75-1 . . . 75-N terminating the transmit paths 70-1 . . . 70-N of the radio station 1. The signal conditioner 501 is adapted to impose phase and magnitude differences 800 between the antenna elements 75-1 . . . 75-N. The phase and magnitude differences 800 comprise a transmit phase and magnitude difference 800T accumulated along the transmit paths 70-1 . . . 70-N. In FIG. 5b only three receive paths 510-1, . . . , 510-N are shown. The signal conditioner 501 may be implemented as a DSP. It is further possible for the signal conditioner 501 to comprise the DSP of the radio station 1. The signal conditioner 501 may be adapted to derive the transmit magnitude and phase deviations 800T accumulated along the transmit paths 70-1, . . . , 70-N of the radio station 1.

Figure 5C:
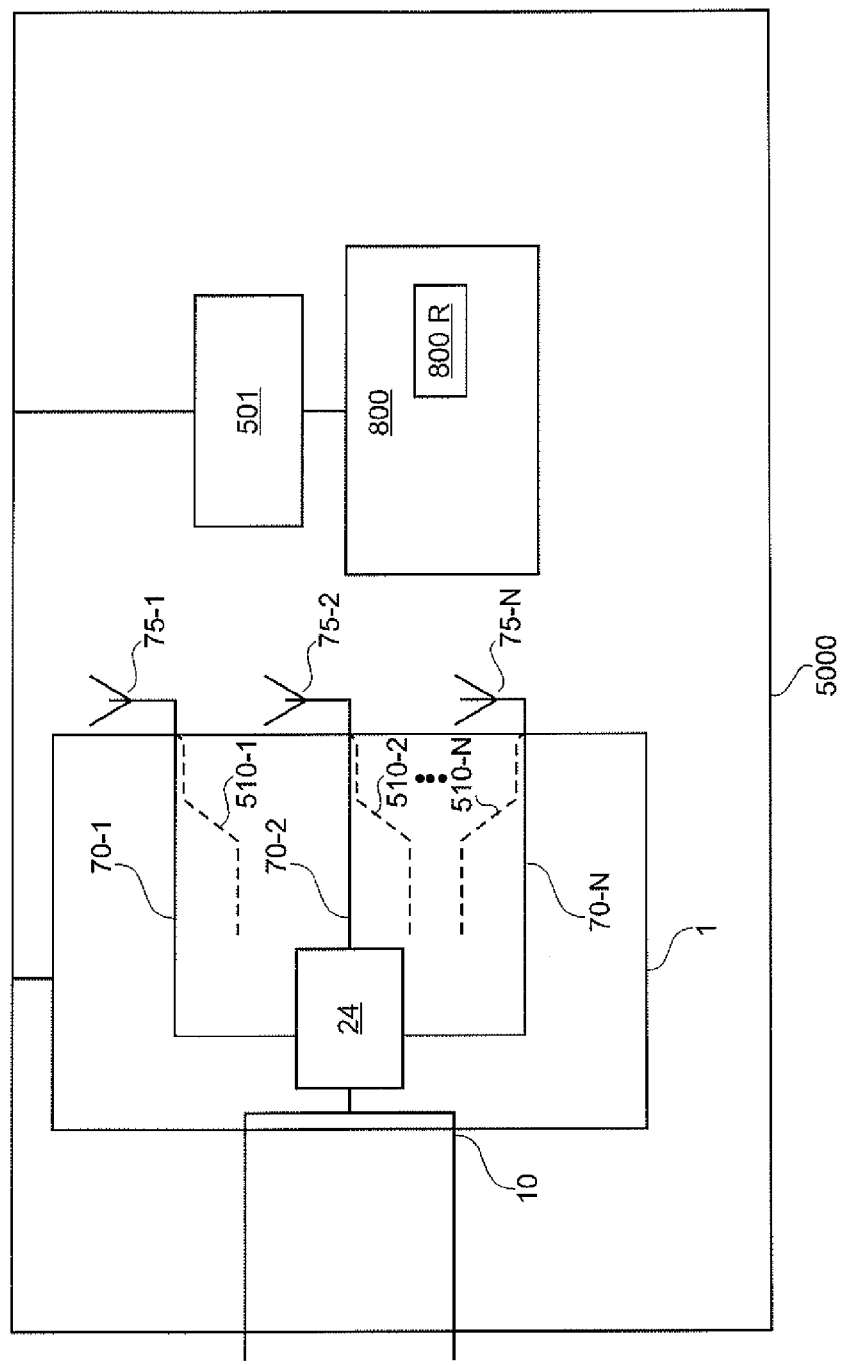
FIG. 5c shows a bock diagram of a further aspect of the active antenna array according to the present disclosure.

FIG. 5c shows a block diagram of a further aspect of the active antenna array 5000 comprising the plurality of antenna elements 75-1 . . . 75-N terminating the transmit paths 70-1 . . . 70-N of the radio station 1. In view of the embodiment of FIG. 5b, the signal conditioner 501 according to the embodiment of FIG. 5c is adapted to impose phase and magnitude differences 800 between the antenna elements 75-1 . . . 75-N and the phase and magnitude differences 800 only comprise a receive phase and magnitude difference 800R accumulated along at least one receive path 510 1, . . . , 510-N. In FIG. 5c only three receive paths 510-1, . . . , 510-N are shown. The signal conditioner 501 may be implemented as a DSP. It is further possible for the signal conditioner 501 to comprise the DSP of the radio station 1.

The active antenna array 5000 comprising the radio station 1 of the present disclosure allows for the dimensions of the active antenna array 5000 to define the global dimensions of the radio station 1. The radio station 1 can be implemented on a chip, wherein the overall dimensions of the active antenna array 5000 as well as the overall dimensions of the radio station 1 are substantially governed by the dimensions of the active antenna array 5000, i.e. all the antenna elements 75-1, . . . , 75-N of the active antenna array 5000.

The invention claimed is:

1. A radio station comprising:
    a digital predistortion module adapted to impose a digital predistortion on a payload signal,
    at least two transmit paths adapted to relay the payload signal as at least two transmit signals,
    an RF amplifier within the at least two transmit paths adapted to amplify the payload signal,
    an antenna element or sub-array terminating the at least two transmit paths,
    a coupler adapted to extract at least two coupled transmit signals out of the at least two transmit signals,
    a combiner adapted to combine the at least two coupled transmit signals into a common feedback signal;
    a common feedback path adapted to feed the common feedback signal to a digital predistortion update module adapted to update the digital predistortion of the at least two transmit paths based on extracted distortion information from the common feedback signal;
thus linearising transfer characteristics of at least two of the transmit paths.

2. The radio station according to claim 1, wherein the predistortion module comprises a digital signal processor.

3. The radio station according to claim 1, further comprising an input stage adapted to accept the payload signal.

4. The radio station according to claim 1, wherein the at least two transmit paths comprise a digital-to-analogue converter.

5. The radio station according to claim 4, wherein the digital-to-analogue-converter comprises a delta-sigma digital-to-analogue converter.

6. The radio station according to claim 1, wherein the at least two transmit paths further comprises a band pass filter.

7. The radio station according to claim 1, wherein the common feedback path comprises an attenuator.

8. The radio station according to claim 1, further comprising at least one attenuator upstream of the combiner.

9. The radio station according to claim 1, wherein the common feedback path further comprises an analog-to-digital converter adapted to digitize the common feedback signal.

10. The radio station according to claim 9, wherein the analogue-to-digital converter comprises a delta-sigma analogue-to-digital converter.

11. A method for digitally predistorting a payload signal, the method comprising:
    providing the payload signal to be relayed as a at least two transmit signals along at least two transmit paths,
    imposing a digital predistortion on the payload signal,
    extracting at least two coupled transmit signals out of the at least two transmit signals,
    combining at least two coupled transmit signals, thus forming a common feedback signal,
    updating the digital predistortion of the at least two transmit paths based on extracted distortion information from the common feedback signal;
thereby linearising a transfer characteristics of at least two of the transmit paths.

12. The method according to claim 11, further comprising:
    analogue-to-digital converting the at least two transmit signals.

13. The method according to claim 12, wherein the converting comprises:
    digital-to-analogue converting using a delta-sigma converter.

14. The method according to claim 12, wherein the converting further comprises:
  digital-to-analogue converting using an analogue-to-digital converter,
  upconverting the at least two transmit signals.

15. The method according claim 11, further comprising: amplifying the at least two transmit signals.

16. The method according claim 11, further comprising: filtering the at least two transmit signals.

17. The method according claim 11, further comprising: attenuating the common feedback signal.

18. The method according claim 11, further comprising: attenuating at least two of the coupled transmit signals.

19. The method according claim 11, further comprising: analogue-to-digital converting the common feedback signal.

20. The method according claim 11, wherein the updating comprises:
  delaying the payload signal thus forming a delayed payload signal.

21. The method according claim 11, wherein the updating comprises
  averaging the common feedback signal,
  extracting of differences between the common feedback signal and at least one of the payload signal or the delayed payload signal.

22. Computer program product embodied on a non-transitory computer-readable medium and comprising executable instructions for the manufacture of a radio station, the radio station comprising:
  a digital predistortion module adapted to impose a digital predistortion on a payload signal,
  at least two transmit paths adapted to relay the payload signal as at least two transmit signals,
  an RF amplifier within the at least two transmit paths adapted to amplify the payload signal,
  an antenna element or sub-array terminating the at least two transmit paths,
  a coupler adapted to extract at least two coupled transmit signals out of the at least two transmit signals,
  a combiner adapted to combine the at least two coupled transmit signals into a common feedback signal;
  a common feedback path adapted to feed the common feedback signal to a digital predistortion update module adapted to update the digital predistortion of the at least two transmit paths based on extracted distortion information from the common feedback signal;
thus linearising transfer characteristics of at least two of the transmit paths.

23. Non-transitory computer program product comprising instructions that enable a processor to carry out a method for digitally predistorting a payload signal, the method comprising:
  providing the payload signal to be relayed as at least two transmit signals along at least two transmit paths,
  imposing a digital predistortion on the payload signal,
  extracting at least two coupled transmit signals out of the transmit signals,
  combining at least two of the at coupled transmit signals, thus forming a common feedback signal,
  updating the digital predistortion of the at least two transmit paths based on extracted distortion information from the common feedback signal;
thereby linearising a transfer characteristics of at least two of the transmit paths.

24. An active antenna array comprising:
  a radio station comprising:
    a digital predistortion module adapted to impose a digital predistortion on a payload signal,
    at least two transmit paths adapted to relay the payload signal as at least two transmit signals,
    an RF amplifier within the at least two transmit paths adapted to amplify the payload signal,
    an antenna element or sub-array terminating the at least two transmit paths,
    a coupler adapted to extract at least two coupled transmit signals out of the transmit signals,
    a combiner adapted to combine the at least two coupled transmit signals into a common feedback signal;
    a common feedback path adapted to feed the common feedback signal to a digital predistortion update module adapted to update the digital predistortion of the at least two transmit paths based on extracted distortion information from the common feedback signal;
  thus linearising transfer characteristics of at least two of the transmit paths;
  wherein the antenna element or sub-array comprises an adjustable phase and magnitude between individual ones of the antenna elements or sub-arrays; and
  a signal conditioner adapted to impose phase and magnitude differences between the antenna elements.

25. The active antenna array according to claim 24, further comprising
  at least one receive path terminated by the antenna element, wherein the at least one receive path is adapted to receive a receive signal.

26. The active antenna array according claim 24, wherein the phase and magnitude difference comprises a transmit phase and magnitude difference accumulated along the at least two transmit paths.

27. The active antenna array according claim 24, wherein the phase and magnitude difference comprises a receive phase and magnitude difference accumulated along the at least one receive path for at least one of the at least one receive paths.

28. The active antenna array according claim 24, wherein the signal conditioner comprises a digital signal processor.

29. The active antenna array according claim 24, wherein the signal conditioner comprises the digital signal processor of the radio station.

30. The active antenna array according claim 24, wherein the signal conditioner is further adapted to derive the transmit magnitude and phase deviations.

31. The active antenna array according claim 24, wherein the signal conditioner is further adapted to derive the receive magnitude and phase deviation.

32. The active antenna array according claim 24, wherein the signal conditioner is adapted to impose phase and magnitude changes on the at least two of the transmit paths, such that the transmission of the active antenna array substantially comprises a defined phase and magnitude relation between at least one pair of the antenna elements.

33. The active antenna array according claim 24, wherein the signal conditioner is adapted to impose phase and magnitude changes on at least two of the of the at least one receive paths, such that the reception of the active antenna array substantially comprises a defined phase and magnitude relation between at least one pair of the receive signals.

34. The active antenna array according claim 24, wherein the transmission of the active antenna array is substantially coherent between at least one pair of the antenna elements.

35. The active antenna array according claim 24, wherein the active antenna array is adapted to provide at least one of beam forming, down tilting, beam diversity and direction of arrival detection.

* * * * *

UNITED STATES PATENT AND TRADEMARK OFFICE
CERTIFICATE OF CORRECTION

PATENT NO. : 8,477,871 B2
APPLICATION NO. : 12/648000
DATED : July 2, 2013
INVENTOR(S) : Dirk Neumann et al.

Page 1 of 1

It is certified that error appears in the above-identified patent and that said Letters Patent is hereby corrected as shown below:

In the Specification:

Col. 16 lines 49-57, delete the text beginning with "The active antenna array 5000" and ending with "75-N of the active antenna array 5000.".

Col. 17 line 33 to Col. 18 line 3, the text beginning with "FIG. 5b shows a block diagram" and ending with "75-N of the active antenna array 5000." is moved to Col. 16 starting after line 57.

Signed and Sealed this
Twenty-seventh Day of August, 2013

Teresa Stanek Rea
*Acting Director of the United States Patent and Trademark Office*